United States Patent
Gu et al.

[19]

[11] Patent Number: 5,920,084

[45] Date of Patent: *Jul. 6, 1999

[54] LCD WITH INCREASED PIXEL OPENING SIZES

[75] Inventors: Tieer Gu; Willem den Boer, both of Troy, Mich.

[73] Assignee: OIS Optical Imaging Systems, Inc., Northville, Mich.

[*] Notice: This patent is subject to a terminal disclaimer.

[21] Appl. No.: 08/962,892

[22] Filed: Nov. 14, 1997

Related U.S. Application Data

[63] Continuation of application No. 08/470,271, Jun. 6, 1995, abandoned.

[51] Int. Cl.$^6$ ............... H01L 29/04; H01L 31/036; H01L 31/0376; H01L 31/20
[52] U.S. Cl. ............... 257/59; 257/52; 257/57; 349/56; 349/38
[58] Field of Search ............... 257/59, 52, 57; 349/57, 59, 138

[56] References Cited

U.S. PATENT DOCUMENTS

| | | |
|---|---|---|
| 4,980,002 | 12/1990 | Dzarnoski, Jr. et al. |
| 5,003,356 | 3/1991 | Wakai et al. ............... 357/4 |

(List continued on next page.)

FOREIGN PATENT DOCUMENTS

| | | |
|---|---|---|
| 0603866 | 6/1994 | European Pat. Off. |

OTHER PUBLICATIONS

"Benzocyclobutene as a Planarization Resin for Flat Planel Displays" by Perettie, et. al., SPIE vol. 1665 Crystal Materials, Devices, and Applications, 1992.

"A Multi–Level High Density Interconnect Process Designed & Developed for Manufacturability" by Finchem, et. al., Dec. 1994.

"Reactive Ion Etching of Benzocyclobutene Using A Silicon Nitride Dielectric Etch Mask" by Schier, J. Electrochem Soc., vol. 142, No. 9, Sep. 1995.

"High Density Multilayer Substrate Using Benzocyclobutene Dielectric" by Shimoto, et. al., IMC 1992 Proceedings, Yokohama, Jun. 3–5, 1992.

"Optimisation of very Small Pitch Active Matrix LCD For Projection" by Vignolle, et. al., IEEE, 1991 no month.

"A High–Aperture–Ratio 3 in.—Diagonal VGA a–Si Light Valve with Pixel/Data and Pixel/Gate Lines Overlapping" by Sakamoto, et. al. SID 1996 Digest no month.

"High Aperture and Fault–Tolerant Pixel Structure for TFT–LCDS" by Kim, et. al., SID 1995 Digest no month.

"A 6.4—in—Diagonal Color TFT–LCD Module Suitable for Personal Information Tools" by Takeda et al, SID 94 Digest no month.

"Invited Address: High Aperture TFT Array Structures" by Suzuki, SID 94 Digest no month.

"A High–Aperture–Ratio TFT–LCD with a Shield–Electrode Structures" by UEDA et al, SID 93 Digest no month.

*Primary Examiner*—Mahshid Saadat
*Assistant Examiner*—Allan R. Wilson
*Attorney, Agent, or Firm*—Joseph A. Rhoa

[57] ABSTRACT

A liquid crystal display having an increased pixel aperture ratio is disclosed along with a method of making same. An array of a-Si TFTs is deposited on a transparent substrate. Subsequently, an organic insulating layer (e.g. Benzocyclobutene) and a corresponding array of pixel electrodes are deposited over the TFT array so that the pixel electrodes overlap the display address lines thereby increasing the display's pixel aperture ratio. The low dielectric constant $\epsilon$ (e.g. about 2.7) and relatively high thickness (e.g. greater than about 1.5 $\mu$m) of the insulating layer reduce the pixel electrode-address line parasitic capacitance $C_{PL}$ in the overlap areas thereby reducing cross-talk (or capacitive coupling) in the display. In sum, an increased pixel aperture ratio is achieved without sacrificing display performance.

17 Claims, 7 Drawing Sheets

U.S. PATENT DOCUMENTS

| | | |
|---|---|---|
| 5,055,899 | 10/1991 | Wakai et al. . |
| 5,182,620 | 1/1993 | Shimada et al. . |
| 5,246,782 | 9/1993 | Kennedy et al. . |
| 5,287,208 | 2/1994 | Shimoto et al. . |
| 5,302,987 | 4/1994 | Kanemori et al. ......... 359/58 |
| 5,364,547 | 11/1994 | Babb et al. . |
| 5,409,777 | 4/1995 | Kennedy et al. . |
| 5,414,278 | 5/1995 | Kobayashi et al. ......... 257/72 |
| 5,414,547 | 5/1995 | Matsuo et al. ......... 359/67 |
| 5,419,991 | 5/1995 | Segawa ......... 430/20 |
| 5,422,293 | 6/1995 | Konya ......... 437/50 |
| 5,426,523 | 6/1995 | Shimada et al. ......... 359/54 |
| 5,446,562 | 8/1995 | Sato ......... 359/59 |
| 5,453,857 | 9/1995 | Takahara ......... 359/57 |
| 5,457,553 | 10/1995 | Mori ......... 359/59 |
| 5,459,596 | 10/1995 | Ueda et al. ......... 349/39 |
| 5,463,230 | 10/1995 | Negoto et al. ......... 257/66 |
| 5,463,484 | 10/1995 | Brody ......... 359/68 |
| 5,483,366 | 1/1996 | Atherton ......... 359/59 |
| 5,528,209 | 6/1996 | Macdonald et al. ......... 333/247 |
| 5,682,211 | 10/1997 | Yao et al. . |

FIG. 6
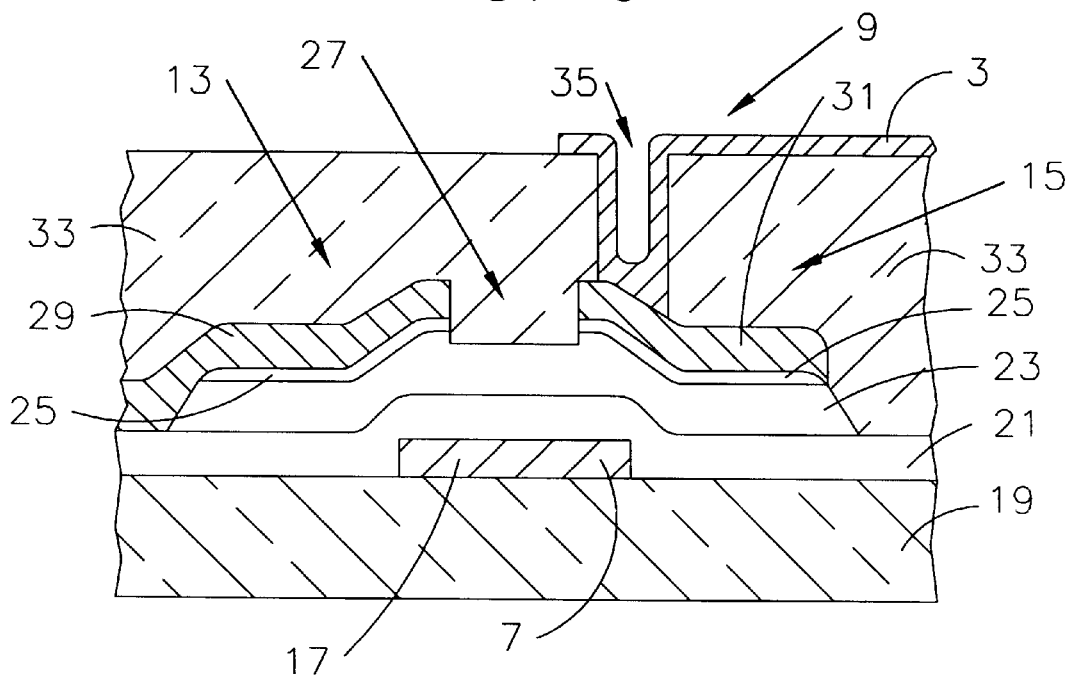
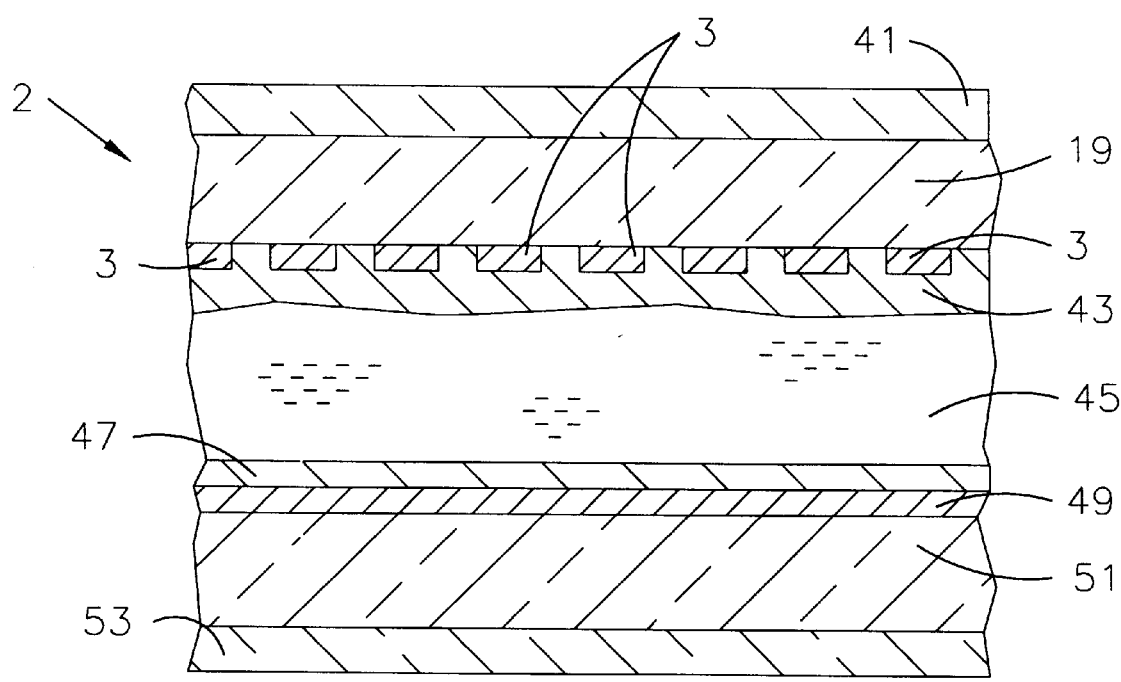
FIG. 7

LCD WITH INCREASED PIXEL OPENING SIZES

This is a continuation of application Ser. No. 08/470,271, filed on Jun. 6, 1995 now abandoned.

This invention relates to a liquid crystal display (LCD) having an increased pixel aperture ratio. More particularly, this invention relates to a liquid crystal display including an array of TFTs (and method of making same) wherein an insulating layer having a plurality of contact vias or apertures etched therein is disposed between the TFTs and the pixel electrodes so that the pixel electrodes of the display are permitted to overlap the row and column address lines without exposing the display to capacitive cross-talk.

BACKGROUND OF THE INVENTION

Active matrix liquid crystal display (AMLCD) devices are typically composed of a matrix of liquid crystal pixels arranged horizontally in rows and vertically in columns. Such devices typically include first and second opposing polarizers, a liquid crystal layer disposed between the polarizers, and substantially transparent electrodes mounted on opposite sides of the liquid crystal (LC) layer so as to selectively energize same in order to create an image for a viewer.

Electronic matrix arrays find considerable applications in AMLCDs. Such AMLCDs generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are liquid crystal display pixels or alternatively the memory cells of an electronically adjustable memory array.

Typically, a switching device such as a thin film transistor (TFT) is associated with each array element or pixel. The isolation device permit the individual pixels to be selectively addressed by the application of suitable potentials between respective pairs of the X and Y address lines. Thus, the TFTs act as switching elements for energizing corresponding pixel electrodes.

Amorphous silicon (a-Si) TFTs have found wide usage for isolation devices in LCD arrays. Structurally, TFTs generally include substantially co-planar source and drain electrodes, a semiconductor material (e.g. a-Si) disposed between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted.

Typically, pixel aperture ratios (i.e. pixel openings) in non-overlapping AMLCDs are only about 50%. As a result, either display luminance is limited or backlight power consumption is excessive, thereby precluding or limiting use in portable applications. Thus, it is known in the art that it is desirable to increase the pixel aperture ratio or pixel opening size of LCDs to as high a value as possible so as to circumvent these problems. The higher the pixel aperture ratio (or pixel opening size) of a display, the higher the display transmission. Thus, by increasing the pixel aperture ratio of a display, transmission may be increased using the same backlight power, or alternatively, the backlight power consumption may be reduced while maintaining the same display transmission.

Currently, a common way of making AMLCDs is to pattern the ITO pixel electrodes at a distance or gap of about 5–10 μm from the bus lines which results in the LC material in this gap area not being activateable. Thus, the black matrix is required on the passive plate to overlap the pixel electrodes by about 5–10 μm so as to avoid light leakage in these areas and to compensate for potential plate misalignment. Thus, there exists a need in the art to eliminate this problem while simultaneously increasing pixel size.

For example, "High-Aperture TFT Array Structures" by K. Suzuki discusses an LCD having an ITO shield plane configuration having a pixel aperture ratio of 40% and pixel electrodes which overlap signal bus lines. An ITO pattern in Suzuki located between the pixel electrodes and the signal lines functions as a ground plane so as to reduce coupling capacitance between the signal lines and the pixel electrode. Unfortunately, it is not always desirable to have a shield electrode disposed along the length of the signal lines as in Suzuki due to production and cost considerations. The disposition of the shield layer as described by Suzuki requires extra processing steps and thus presents yield problems. Accordingly, there exists a need in the art for a LCD with an increased pixel aperture ratio which does not require an ITO shield plane structure to be disposed between the signal lines and pixel electrode.

FIG. 1 is a side elevational cross-sectional view of prior art linear thin film transistor (TFT) 100 of U.S. Pat. No. 5,055,899. A plurality of TFTs 100 are typically arranged on transparent insulating substrate 101 in the form of a matrix array as set forth in the '899 patent. Each TFT 100 includes gate electrode 102 connected to gate address line 113 (see FIG. 2) extending in the row direction, drain electrode 106 connected to drain line 114 extending in the column direction, and source electrode 107 connected to transparent pixel electrode 110 independently formed in the pixel area defined between the array of gate lines 113 and drain lines 114. Pixel electrode 110 operates in conjunction with an opposing common electrode (not shown) on the other side of the liquid crystal layer (not shown) so as to selectively drive the pixel enabling the respective polarizers to transmit or absorb light rays in order to create an image for the viewer. A TFT electrode, to which a data signal is supplied, will be referred to hereinafter as a drain electrode, while the TFT electrode attached to the pixel electrode will be referred to as a source electrode.

More specifically, as shown in prior art FIGS. 1–2, gate electrode 102 of prior art TFT 100 is formed on clear substrate 101. Gate insulating film 103, made of silicon oxide, for example, is formed or deposited on substrate 101 over top of gate electrode 102. Semiconductor film 104, made of amorphous silicon (a-Si), for example, is deposited on substrate 101 over top of gate insulating film 103 and gate 102. Drain and source electrodes 106 and 107 respectively are deposited on substrate 101 over top of layers 103 and 104. The linear-shaped source and drain electrodes are separated from one another by a predetermined distance forming TFT channel 105. Drain and source electrodes 106 and 107 respectively utilize doped a-Si contact layers 106a and 107a in combination with drain-source metal layers 106b and 107b so as to form electrical connections with semiconductor layer 104.

Insulating film 108 is deposited on substrate 101 over the source and drain electrodes to a thickness falling within the range of 2,000 to 8,000 Å, preferably about 3,000 Å. Insulating layer 108 may be an organic insulating film obtained by spin-coating and baking polyimide or an acrylic resin, or a silicon oxide inorganic insulating film (SOG film) obtained by spin-coating and baking a silanol compound. Subsequent to the deposition of insulating film 108 on the source and drain electrodes, vias 112 are formed in layer 108 for the purpose of allowing substantially transparent pixel electrodes 110 to contact source electrodes 107. Thus, when a pixel electrode 110 is deposited and patterned over top of insulating layer 108, a portion of it is formed in via 112 as shown in FIG. 1 so as to contact source 107 at point 109. Pixel electrode 110 may be indium-tin-oxide (ITO), for example, and is sputtered on the surface of insulating layer 108 and in via 112 to a thickness of about 1,000 Å.

As can be seen in FIG. 2, pixel electrode 110 in certain embodiments of the '899 patent is located completely within the confines of gate line 113 and drain line 114. In other words, as illustrated in FIG. 2, pixel electrode 110 does not overlap either of the address lines. However, it is stated in column 7 of the '899 patent that "transparent electrode 110 may be arranged so as to overlap the drain and gate lines 114 and 113." It is further stated that "hence a maximum effective display area can be obtained . . . an opening ratio of 70% can be realized." In other words, the '899 patent discloses as an alternative embodiment forming pixel electrode 110 so that it overlaps address lines 113 and 114 for the purpose of increasing the pixel opening size or pixel aperture ratio of the AMLCD.

Unfortunately, if pixel electrode 110 of the '899 patent AMLCD is arranged so as to overlap address lines 113 and 114, an undesirably high parasitic capacitance results in the overlap areas between pixel electrode 110 and the address lines. In other words, in the overlap areas, pixel electrode 110 forms a capacitor in combination with the overlapped address lines. The resulting parasitic capacitance $C_{PL}$ between the pixel electrode 110 and the address lines in the overlap areas is defined as follows:

$$C_{PL} = \frac{(\epsilon \cdot \epsilon_0 \cdot A)}{d}$$

where "$\epsilon$" is the dielectric constant of insulating layer 108, "$\epsilon_0$" is a constant value of $8.85 \times 10^{-14}$ F/cm, "A" is the area of the resulting capacitor in the overlap area, and "d" is the thickness of insulating layer 108 in the overlap area.

Because of the above-referenced thin profile of insulating layer 108 in the '899 patent, the resulting parasitic capacitance $C_{PL}$ created by the overlap is undesirably high thereby resulting in capacitive cross-talk in the LCD. Such cross-talk results when the signal voltage intended to be on a particular pixel is not there. Thus, when $C_{PL}$ is too high, the voltage on the pixel is either higher or lower than intended depending upon how much voltage the other pixels on the signal address line received. In other words, the pixel is no longer satisfactorily isolated when $C_{PL}$ is too high.

In view of the above with respect to the '899 patent, it is clear that there exists a need in the art for a liquid crystal display having both an increased pixel aperture ratio and reduced capacitive cross-talk in overlap areas so as to simultaneously properly isolate each pixel and increase the pixel openings in order to allow the LCD to be easily used in portable applications with reduced power consumption.

Further with respect to U.S. Pat. No. 5,055,899, the disclosure of this patent does not appreciate the importance of the dielectric constant $\epsilon$ of insulating layer 108. While referencing numerous materials including $SiO_2$ which may be used for layer 108, the '899 patent does not discuss either the dielectric constant values $\epsilon$ of these materials or their importance in helping reduce $C_{PL}$ in overlap areas. For example, the dielectric constant $\epsilon$ of $SiO_2$ (which the '899 patent states may be used as layer 108) is undesirably high (about 3.9) thereby causing $C_{PL}$ to be too high. When $\epsilon$ of the insulating layer is too high, capacitive cross-talk results in the display. In view of this, it is apparent that there exists a need in the art for an insulating layer to be disposed between the TFT electrodes (and address lines) and the pixel electrodes, this insulating layer having a dielectric constant value sufficient to reduce $C_{PL}$ in overlap areas thereby substantially eliminating cross-talk problems in LCDs where the pixel electrodes overlap the address lines.

U.S. Pat. No. 5,182,620 discloses an AMLCD in which the pixel electrodes at least partially overlay the signal lines and an additional capacitor common line thereby achieving a larger numerical aperture for the display.

Unfortunately, the '620 patent suffers from at least the following problems. Firstly, the problems discussed above with respect to the '899 patent are all applicable to the '620 patent. Secondly, due to the additional capacitor common lines of the '620 patent, the pixel aperture ratio of the display is limited to about "48%". This is caused by the AMLCD design where the storage capacitor address lines are separate lines parallel to the column address lines thus resulting in reduced pixel aperture ratios. The AMLCD of the '620 patent uses the additional storage capacitor lines to suppress the effect of $C_{PL}$ in the overlap area between the pixel electrode and the source. However, the presence of the additional storage capacitor lines is undesirable in that it reduces pixel aperture ratios and increases manufacturing costs.

Additional problems of the AMLCD of the '620 patent are that the pixel aperture ratio is not as great as would otherwise be desired in view of the fact that the pixel electrode does not overlap all address lines, and the required presence of three insulating layers.

It is apparent from the above that there exists a need in the art for an LCD having an increased pixel aperture ratio and substantially no capacitive cross-talk problems which is commercially feasible to manufacture, and a method of making same. Additionally, there exists a need in the art for a TFT and method of making same for implementing the increased pixel aperture ratios and the virtual elimination of cross-talk problems into the display.

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing a liquid crystal display with a large pixel aperture ratio comprising:

a liquid crystal layer sandwiched between first and second substrates;

an array of thin film transistors (TFTs) and corresponding pixel electrodes mounted on the first substrate, each of the thin film transistors including a semiconductor layer, a gate electrode connected to a gate address line, a drain electrode connected to a drain address line, and a source electrode connected to one of the corresponding pixel electrodes, and wherein the pixel electrode connected to the source electrode overlaps the gate and drain address lines along longitudinal edges thereof; and a substantially continuous insulating layer having a dielectric constant ε no greater than about 3.0 disposed between the pixel electrode and the address lines in sufficient thickness so as to reduce capacitive cross-talk in the display by reducing the pixel electrode-address line parasitic capacitance $C_{PL}$ in the areas of overlap.

This invention further fulfills the above-described needs in the art by providing a thin film transistor (TFT) structure comprising:

a substantially transparent substrate;

a gate electrode located on the substrate and adapted to be connected to a first address line;

a semiconductor layer located on the substrate over the gate electrode;

a drain electrode located on the substrate over the semiconductor layer and adapted to be connected to a second address line;

a source electrode located on the substrate over the semiconductor layer and spaced from the drain electrode so as to define a transistor channel, the source electrode adapted to be electrically connected to a pixel electrode;

and insulating layer located on the substrate over the source and drain electrodes, the insulating layer being of sufficient thickness "d" and having a sufficiently low dielectric constant value ε so that when the pixel electrode overlaps one of the first and second address lines, the resulting pixel electrode-address line parasitic capacitance $C_{PL}$ is sufficiently low so as to substantially eliminate cross-talk.

This invention further fulfills the above-described needs in the art by providing a liquid crystal display comprising:

a liquid crystal layer;

a substantially transparent substrate adjacent the liquid crystal layer;

an array of thin film transistors disposed on the substrate, the thin film transistors connected to address lines and acting as switching elements for energizing corresponding pixel electrodes;

a substantially transparent planarization layer disposed on the array of transistors, the planarization layer being located between the pixel electrodes and the address lines; and wherein the planarization layer includes Benzocyclobutene (BCB) and has a dielectric constant of less than about 3.0.

This invention still further fulfills the above-described needs in the art by providing a method of making a liquid crystal display including an array of TFTs, the method comprising the steps of:

providing a substantially transparent first substrate;

disposing a gate metal layer on the first substrate and patterning an array of TFT gate electrodes and gate address lines therefrom;

disposing a semiconductor layer on the first substrate over the gate electrodes and patterning the semiconductor layer to form TFT areas;

disposing and patterning drain and source electrodes on the substrate over the semiconductor layer;

providing drain address lines for addressing the drain electrodes;

disposing a substantially continuous organic insulating layer on the substrate over the address lines and the drain and source electrodes to a thickness of at least about 1.5 μm; and disposing and patterning an array of substantially transparent pixel electrodes on the substrate over the insulating layer so that the pattern pixel electrodes overlap at least one of the gate and drain lines in order to increase the displays pixel aperture ratio.

This invention will now be described with reference to certain embodiments thereof as illustrated in the following drawings.

IN THE DRAWINGS

FIG. 6 is a side elevational cross-sectional view of the linear-shaped thin film transistors (TFTs) of FIGS. 3–4.

FIG. 7 is a side elevational cross-sectional view of the liquid crystal display of FIG. 3.

DETAILED DESCRIPTION OF CERTAIN EMBODIMENTS OF THIS INVENTION

Figure 1:
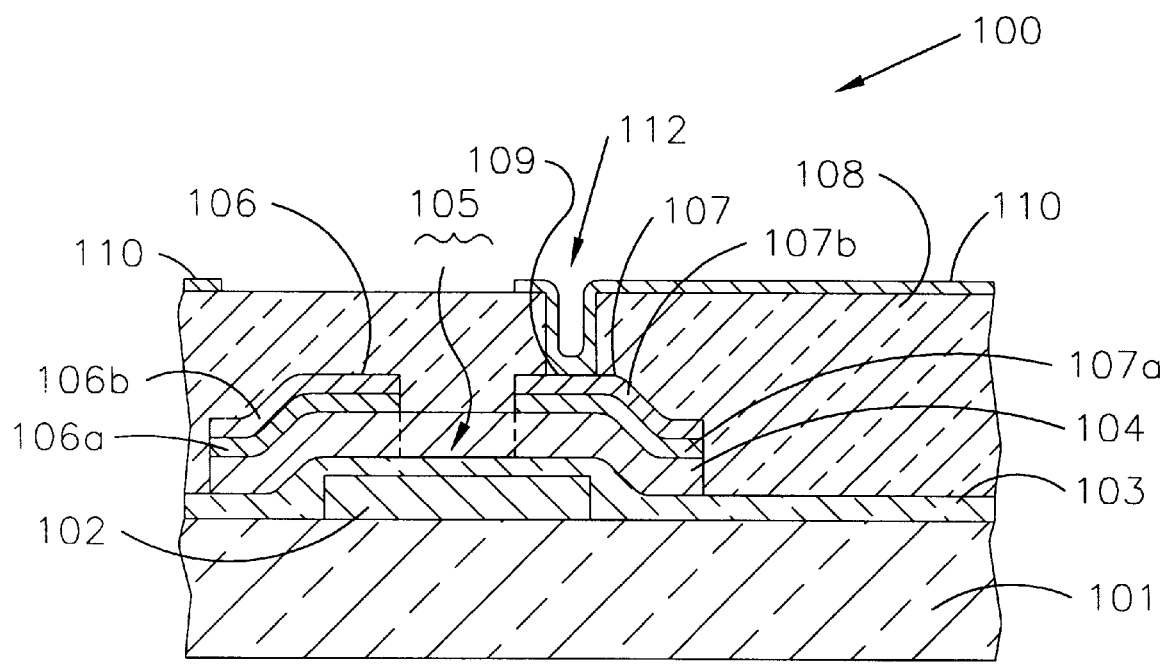
FIG. 1 is a side elevational cross-sectional view of a prior art linear TFT.
Figure 2:
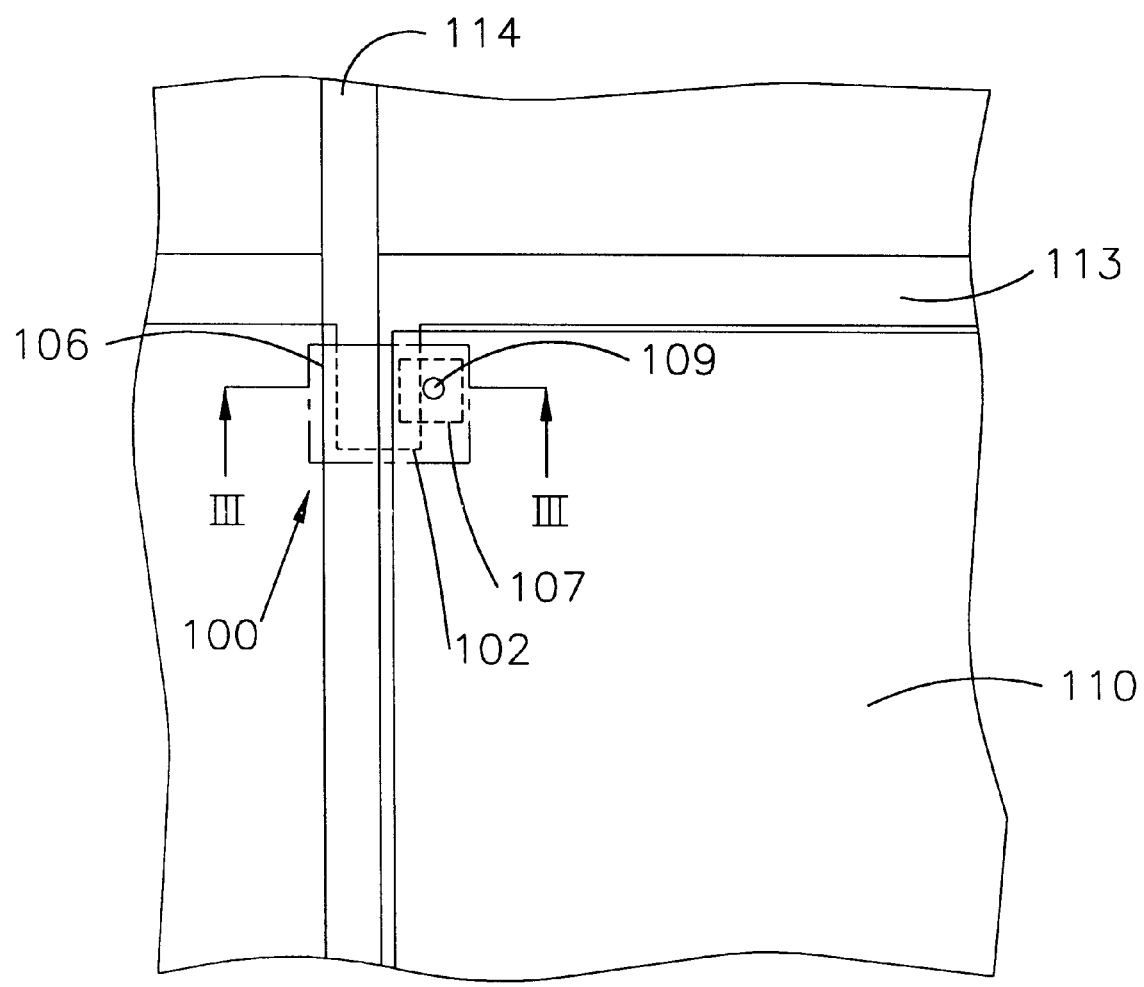
FIG. 2 is a top view of the prior art TFT of FIG. 1 connected to gate and drain address lines and a corresponding pixel electrode in a prior art LCD application.

Referring now more particularly to the accompanying drawings in which like reference numerals indicate like parts throughout the several views.

Figure 3:
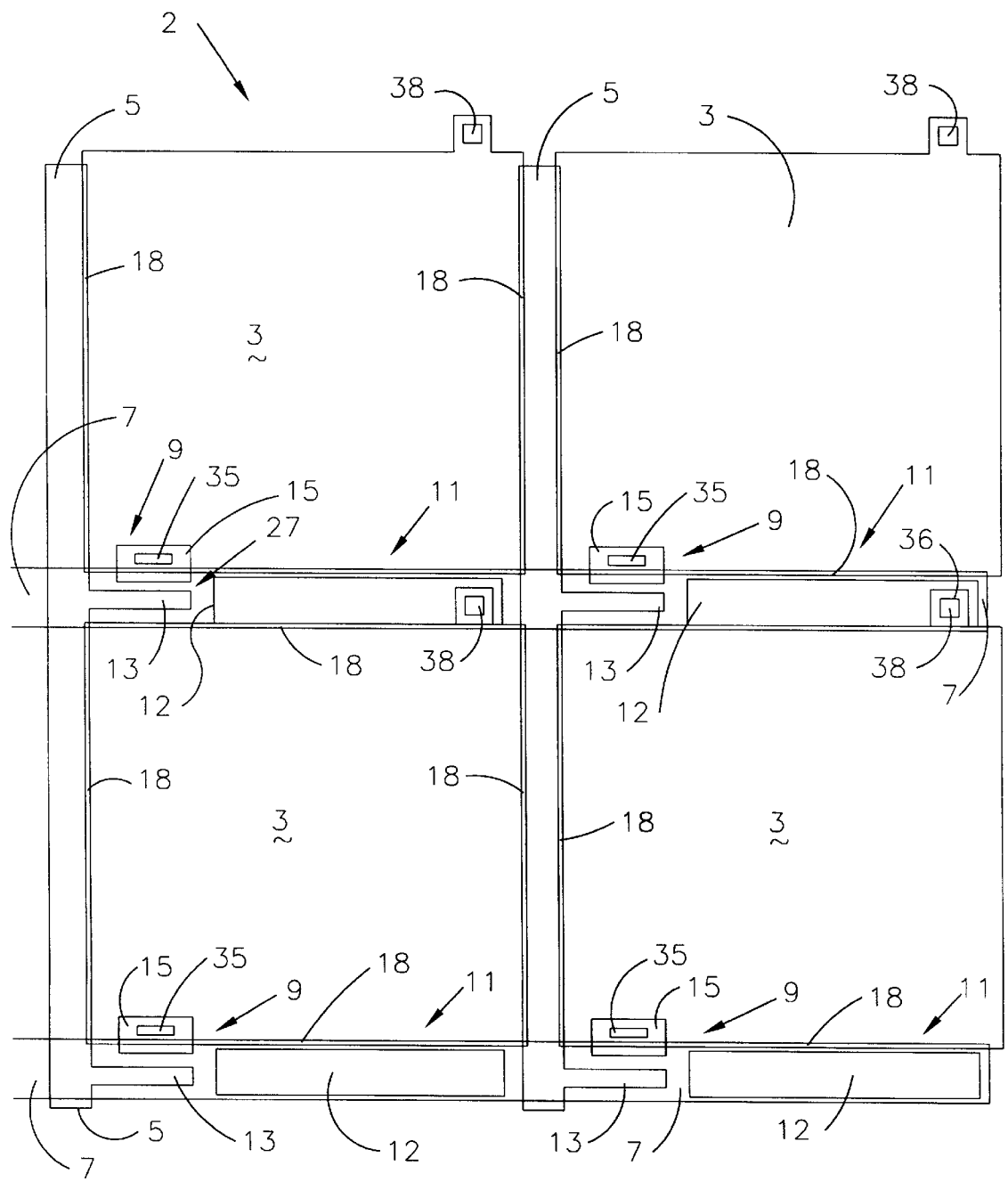
FIG. 3 is a top view of an AMLCD according to this invention, this figure illustrating pixel electrodes overlapping surrounding row and column address lines along their respective lengths throughout the pixel area so as to increase the pixel aperture ratio of the display.

FIG. 3 is a top view of four pixels in active matrix liquid crystal display (AMLCD) 2 according to an embodiment of this invention. This portion of the display includes pixel electrodes 3, drain address lines 5, gate address lines 7, thin film transistors (TFTs) 9, and auxiliary storage capacitors 11. Each storage capacitor 11 is defined on one side by a gate line 7 and on the other side by an independent storage capacitor electrode 12. Storage capacitor electrodes 12 are formed along with drain electrodes 13 so that no additional address line is needed for the storage capacitors. As shown, the longitudinally extending edges of each pixel electrode 3 overlap drain lines 5 and gate lines 7 respectively along the edges thereof so as to increase the pixel aperture ratio (or pixel opening size) of the LCD.

In the areas of overlap 18 between pixel electrodes 3 and address lines 5, 7, a pixel-line (PL) capacitor is defined by an electrode 3 on one side and the overlapped address line on the other. The dielectric disposed between the electrodes of these PL capacitors is planarization layer 33 (see FIG. 6). The parasitic capacitance $C_{PL}$ of these capacitors is defined by the equation:

$$C_{PL} = \frac{\epsilon \cdot \epsilon_0 \cdot A}{d}$$

where "d" is the thickness of planarization layer 33, $\epsilon$ is the dielectric constant of layer 33, $\epsilon_0$ is the constant $8.85 \times 10^{-14}$ F/cm (permitivity in vacuum), and "A" is the area of the PL capacitor in overlap areas 18. It is important that $C_{PL}$ be no greater than about 0.01 pF for a display with a pixel pitch of about 150 μm (i.e. not greater than in a conventional non-overlapping display where silicon nitride is used as a passivation layer between the pixel electrodes and the address lines). When the pixel pitch is smaller, $C_{PL}$ should be scaled to a lower value as well because overlap areas 18 are smaller. Additionally, the pixel aperture ratio of an LCD decreases as the pixel pitch decreases as is known in the art. As will be appreciated by those of skill in the art, the importance of an acceptable (i.e. low) $C_{PL}$ value becomes greater the higher the resolution (or smaller the pixel pitch) of the LCD. The pixel pitch of AMLCD 2 may be from about 40 to 5,000 μm according to certain embodiments of this invention. The pixel pitch as known in the art is the distance between centers of adjacent pixels.

Figure 4:
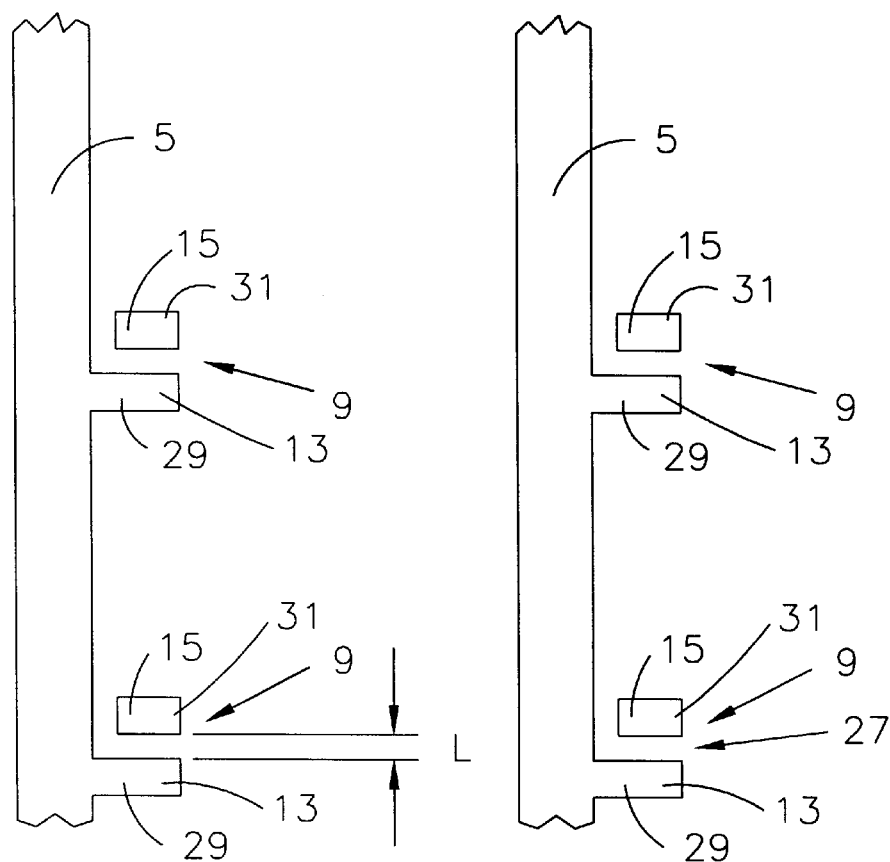
FIG. 4 is a top view of the column (or drain) address lines and corresponding drain electrodes of FIG. 3, this figure also illustrating the TFT source electrodes disposed adjacent the drain electrodes so as to define the TFT channels.

FIG. 4 is a top view of drain address lines 5 of AMLCD 2 showing how extensions of address lines 5 form drain electrodes 13 of TFTs 9. Each TFT 9 of AMLCD 2 includes source electrode 15, drain electrode 13, and gate electrode 17. Gate electrode 17 of each TFT 9 is formed by the corresponding gate address line 7 adjacent the TFT.

Figure 5:
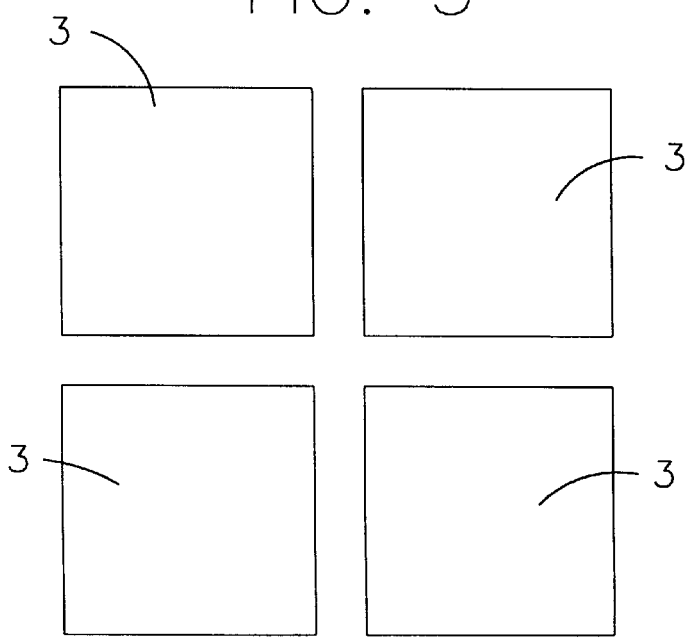
FIG. 5 is a top view of the pixel electrodes of FIG. 3.

FIG. 5 is a top view illustrating pixel electrodes 3 (absent their extension portions 38) of AMLCD 2 disposed in array form. FIGS. 4–5 are provided so that FIG. 3 may be more easily interpreted.

FIG. 6 is a side elevational cross-sectional view of a thin film transistor (TFT) 9 of AMLCD 2. Each linear TFT 9 has a channel length "L" defined by the gap 27 between source electrode 15 and drain electrode 13. Source electrode 15 is connected to pixel electrode 3 so as to permit TFT 9 to selectively energize a corresponding pixel in AMLCD 2 in order to provide image data to a viewer. Thus, each TFT 9 effectively functions as a switch for the corresponding LCD pixel and pixel electrode. An array of TFTs 9 is provided as illustrated in FIG. 3 for AMLCD 2.

Each TFT 9 structure includes substantially transparent substrate 19 (e.g. made of glass), metal gate electrode 17, gate insulating layer or film 21, semiconductor layer 23 (e.g. intrinsic amorphous silicon), doped semiconductor contact layer 25, drain electrode 13, source electrode 15, planarization layer 33, and a pixel electrode 3. TFT channel 27 of length "L" is defined between source 15 and drain 13.

As shown in FIG. 6, drain electrode 13 is made up of drain metal layer 29 (e.g. Mo) which is deposited on substrate 19 over top of doped contact layer 25. Contact film or layer 25 may be, for example, amorphous silicon doped with an impurity such as phosphorous (i.e. n+ a-Si) and is sandwiched between semiconductor layer 23 and drain metal layer 29. Source electrode 15 includes doped semiconductor contact layer 25 and source metal layer 31. Metal layers 29 and 31 may be of the same metal and are deposited and patterned together according to certain embodiments of this invention. Alternatively, layer 29 may be deposited and patterned separately from layer 31 so that drain metal layer is of one metal (e.g. Mo) and source metal layer 31 is of another (e.g. Cr).

Substantially transparent planarization or insulating layer 33 having a low dielectric constant (less than about 3.0) is deposited on substrate 19 so as to cover TFTs 9 and address lines 5 and 7. Layer 33 is continuous in the viewing area of the display except for vias formed to allow pixel electrodes 3 to contact the TFT source electrodes and the storage capacitor electrodes. Planarization layer 33 has a dielectric constant $\epsilon$ less than or equal to about 3.0 according to certain embodiments of this invention. In more preferred embodiments, layer 33 has a dielectric constant of about 2.7 and is made of Benzocyclobutene (BCB) for the purpose of reducing capacitive cross-talk (or capacitive coupling) between pixel electrodes 3 and the address lines in overlap areas 18. In other words, layer 33 has a low dielectric constant (e.g. 2.7) and relatively large thickness for the specific purpose of reducing $C_{PL}$ in overlap areas 18. BCB (an organic material) is produced and is commercially available from Dow Chemical. Other known substantially transparent planarization layers used in the semiconductor and MCM industries may also be used as layer 33 according to alternative embodiments of this invention.

Following the deposition of passivation or planarization layer 33 on substrate 19 over top of TFTs 9 and address lines 5 and 7, substantially transparent pixel electrodes 3 (made of indium-tin-oxide or ITO) are deposited and patterned over layer 33 on substrate 19. Apertures or vias 35 are formed in passivation layer 33 adjacent source electrodes 15 so that the pixel electrodes 3 can contact the corresponding source metal layers 31 of TFTs 9 as illustrated in FIG. 6. Auxiliary vias 36 (see FIG. 3) are formed in layer 33 so that pixel electrodes 3 can contact storage capacitor electrodes 12 via pixel electrode extension areas 38.

Planarization layer 33 is deposited on substrate 19 over the address lines, storage capacitors, and TFTs to a thickness "d" of at least about 1.5 μm in overlap areas 18. In preferred embodiments, the thickness "d" of planarization layer 33 is from about 2 to 3 μm and layer 33 has a degree of planarization of at least about 90% so as to maintain a substantially constant liquid crystal layer thickness across AMLCD 2. An advantage of using planarization layer 33 is that liquid crystal layer disclinations induced at pixel electrode 3 edges by the topography of TFTs 9, storage capacitors, and address lines are substantially eliminated by planarization (i.e. no hills and valleys are present in the top surface of layer 33). Thus, the thickness of the LC layer is substantially maintained and display functionality is improved because electrodes 3 are substantially flat because of the planarization of the surface of layer 33 adjacent the pixel electrodes 3.

Because of the low dielectric constant $\epsilon$ and relatively high thickness "d" of planarization layer 33, the capacitive cross-talk problems of the prior art resulting from overly high $C_{PL}$ values are substantially reduced in areas 18 where pixel electrodes 3 overlap address lines 5 and 7. Thus, because layer 33 (with its relatively low dielectric constant and high thickness) is disposed between pixel electrodes 3 and the overlapped address lines, the capacitive cross-talk problems of the prior art are substantially reduced or eliminated and increased pixel openings are achievable without sacrificing display performance (e.g. pixel isolation). Additionally, no extra processing steps are required to deposit layer 33 as described herein according to certain embodiments of this invention.

Pixel opening sizes or the pixel aperture ratio of AMLCD 2 is at least about 65% (preferably at least about 75%) according to certain embodiments of this invention when the pixel pitch is about 150 μm. This will, of course, vary depending upon the pixel pitch of the display (pixel pitches of from about 40–500 μm may be used). Pixel electrodes 3 overlap address lines 5 and 7 along the edges thereof as shown in FIG. 3 by an amount up to about 3 μm. In certain preferred embodiments of this invention, the overlap 18 of electrodes 3 over the edges of address lines 5 and 7 is designed to be from about 2 to 3 μm, with the end result after overetching being at least about 0.5 μm. According to certain other embodiments of this invention, the amount of overlap may be designed to be from about 2–3 μm, with the resulting post-processing overlap being from about 0 to 2 μm. The overlap amount may be adjusted in accordance with different LCD applications and pixel pitch sizes as will be appreciated by those of skill in the art.

In fact in certain situations, after etching and processing, pixel electrodes 3 may not overlap the address lines at all according to certain embodiments of this invention, although some overlap 18 is preferred. When no overlap occurs, the parasitic capacitance $C_{PL}$ between the address lines and the adjacent pixel electrode 3 is still minimized or reduced due to the low dielectric constant of layer 33.

Referring now to FIGS. 3–6, it will be described how AMLCD 2 including the array of pixel electrodes 3 and corresponding address lines and TFTs 9 is formed according to an embodiment of this invention. Firstly, substantially transparent substrate 19 is provided. Next, a gate metal layer (which results in gate electrodes 17 and lines 7) is deposited on the top surface (surface to be closest to the LC layer) of substrate 19 to a thickness of from about 1,000–5,000 Å, most preferably to a thickness of about 2,500 Å. The gate metal is deposited by way of sputtering or vapor deposition. The gate metal may be of tantalum (Ta) according to certain embodiments of this invention. Insulating substrate 19 may be of glass, quartz, sapphire, or the like.

The structure including substrate 19 and the deposited gate metal is then photomasked to provide a mask pattern corresponding to the desired gate electrode 17 and gate address line 7 configuration. The upper surface of the gate metal is exposed in a window where the photoresist has not been retained.

The gate metal (e.g. Ta) layer is then dry etched (preferably using reactive ion etching) in order to pattern the gate metal layer in accordance with the retained photoresist pattern. To do this, the structure is mounted in a known reactive ion etching (RIE) apparatus which is then purged and evacuated in accordance with known RIE procedures and etchants. This etching of the gate metal layer is preferably carried out until the gate metal is removed in center areas of the windows and is then permitted to proceed for an additional time (e.g. 20 to 40 seconds) of overetching to ensure that the gate metal is entirely removed from within the windows. The result is gate address lines 7 (and gate electrodes 17) being left on substrate 19 as illustrated in FIGS. 3 and 6.

After gate address lines 7 (and therefore electrodes 17) are deposited and patterned on top of substrate 19 in the above-described manner, gate insulating or dielectric layer 21 is deposited over substantially the entire substrate 19 preferably by plasma enhanced chemical vapor deposition (CVD) or some other process known to produce a high integrity dielectric. Gate insulating layer 21 is preferably silicon nitride ($Si_3N_4$) but may also be silicon dioxide or other known dielectrics. Silicon Nitride has a dielectric constant of about 6.4. Gate insulating layer 21 is deposited to a thickness of from about 2,000–3,000 Å (preferably either about 2,000 Å or 3,000 Å) according to certain embodiments.

It is noted that after anodization (which is optional), gate Ta layer 17 which was deposited as the gate electrode and gate line layer (when originally about 2,500 Å thick) is about 1,800 Å thick and a newly created TaO layer is about 1,600 Å. Anodization takes place after the gate line patterning and before further processing. Thus, gate insulating layer 21 over gate lines 7 and electrodes 17 is made up of both the anodization created TaO layer and the silicon nitride layer. Other metals from which gate electrode 17 and address line layer 7 may be made include Cr, Al, titanium, tungsten, copper, and combinations thereof.

Next, after insulating layer 21 has been deposited, semiconductor (e.g. intrinsic a-Si) layer 23 is deposited on gate insulating layer 21 to a thickness of about 2,000 Å. Semiconductor layer 23 may be from about 1,000 Å to 4,000 Å thick in certain embodiments of this invention. Then, doped (typically phosphorous doped, that is n+) amorphous silicon contact layer 25 is deposited over intrinsic a-Si layer 23 in a known manner to a thickness of, for example, about 500 Å. Doped contact layer 25 may be from about 200 Å to 1,000 Å thick according to certain embodiments of this invention.

Gate insulating layer 21, semiconductor layer 23 and semiconductor contact layer 25 may all be deposited on substrate 19 in the same deposition chamber without breaking the vacuum according to certain embodiments of this invention. When this is done, the plasma discharge in the deposition chamber is stopped after the completion of the deposition of a particular layer (e.g. insulating layer 21) until the proper gas composition for deposition of the next layer (e.g. semiconductor layer 23) is established. Subsequently, the plasma discharge is re-established to deposit the next layer (e.g. semiconductor layer 23). Alternatively, layers 21, 23, and 25 may be deposited in different chambers by any known method.

Thereafter, a source-drain metal layer (which results in drain metal layer 29 and source metal layer 31) is deposited on substrate 19 over top of semiconductor layer 23 and contact layer 25. This source-drain metal layer may be chromium (Cr) or molybdenum (Mo) according to certain embodiments of this invention. When chromium, the layer is deposited to a thickness of about 500–2,000 Å, preferably about 1,000 Å according to certain embodiments. When molybdenum, the layer is deposited to a thickness of from about 2,000 to 7,000 Å, preferably about 5,000 Å. The deposited source drain metal layer is then patterned (masked and etched) to form the source, drain, and storage capacitor electrodes.

Alternatively, a first metal layer may be deposited and patterned to form drain electrode portion 29 and storage capacitor electrode 12, and a second metal layer may be deposited and patterned to form source electrode portion 31. Thus, for example, source metal layer 31 may be chromium (Cr) while drain metal and storage capacitor electrode layer 29 is Mo according to certain embodiments of this invention. Other metals which may be used for the source and drain metals include titanium, Al, tungsten, tantalum, copper, or the like.

After patterning of source and drain portions 29 and 31, contact layer 25 is etched in the channel 27 area and inevitably a bit of semiconductor layer 23 is etched along with it. The result is TFT 9 with channel 27 as shown in FIG. 6.

Substantially transparent planarization or insulating layer 33 is then deposited over substantially the entire substrate 19 by way of spin-coating and curing in a nitrogen atmosphere according to certain embodiments of this invention. Planarization layer 33 fills recesses generated upon formation of TFTs 9 and flattens the surface above substrate 19 at least about 90% according to certain embodiments.

Vias or apertures 35 are then formed in planarization layer 33 over top of (or adjacent) each source metal layer 31 so as to permit the pixel electrodes 3 to electrically contact source electrodes 15 through these vias 35. Simultaneously, vias 36 (see FIG. 3) and lead openings adjacent the edges of the panel are formed in layer 33 over storage capacitor electrodes 12.

After vias 35 and 36 are formed in layer 33, a substantially transparent conducting layer (e.g. ITO) which results in pixel electrodes 3 is deposited and patterned (photomasked and etched) on substrate 19 over top of planarization layer 33. After patterning of this substantially transparent conducting layer, pixel electrodes 3 are left as shown in FIGS. 3 and 6. As a result of vias 35 and 36 formed in layer 33, each pixel electrode 3 contacts a source metal layer 31 as shown in FIG. 6 and contacts a storage capacitor electrode 12 as shown in FIG. 3. The result is the active plate of FIGS. 3 and 6. The pixel electrode layer (when made of ITO) is deposited to a thickness of from about 1,200 to 3,000 Å (preferably about 1,400 Å) according to certain embodiments of this invention. Other known materials may be used as pixel electrode layer 3.

After formation of the active plate, liquid crystal layer 45 is disposed and sealed between the active plate and the passive plate as shown in FIG. 7, the passive plate including substrate 51, polarizer 53, electrode 49, and orientation film 47.

As shown in FIG. 3, pixel electrodes 3 are patterned to a size so that they overlap both drain address lines 5 and gate address lines 7 along the edges thereof so as to result in an increased pixel aperture ratio for AMLCD 2. The cross-talk problems of the prior art are substantially eliminated due to the presence of layer 33 with its relatively high thickness and low dielectric constant disposed in overlap areas 18 between pixel electrodes 3 and the address lines.

FIG. 7 is a side elevational cross-sectional view of AMLCD 2 (absent the TFTs, address lines, and black matrix). As shown, the twisted nematic display includes from the rear forward toward the viewer, rear polarizer 41, substantially transparent substrate 19, pixel electrodes 3, rear orientation film 43, liquid crystal layer 45, front orientation film 47, common electrode 49, front substantially transparent substrate 51, and finally front polarizer 53. Polarizers 41 and 53 may be arranged so that their transmission axes are either parallel or perpendicular to each other so as to define a normally black or normally white color AMLCD respectively. Optionally, retarder(s) may also be provided.

Typically, a backlight is provided rearward of polarizer 41 so that light emitted therefrom first goes through polarizer 41, then through liquid crystal layer 45 and finally out of front polarizer 53 toward the viewer. Pixel electrodes 3 selectively work in conjunction with common electrode 49 so as to selectively apply voltages across liquid crystal layer 45 so as to cause an image (preferably colored according to certain embodiments) to be viewed from the front of the display.

Figure 8:
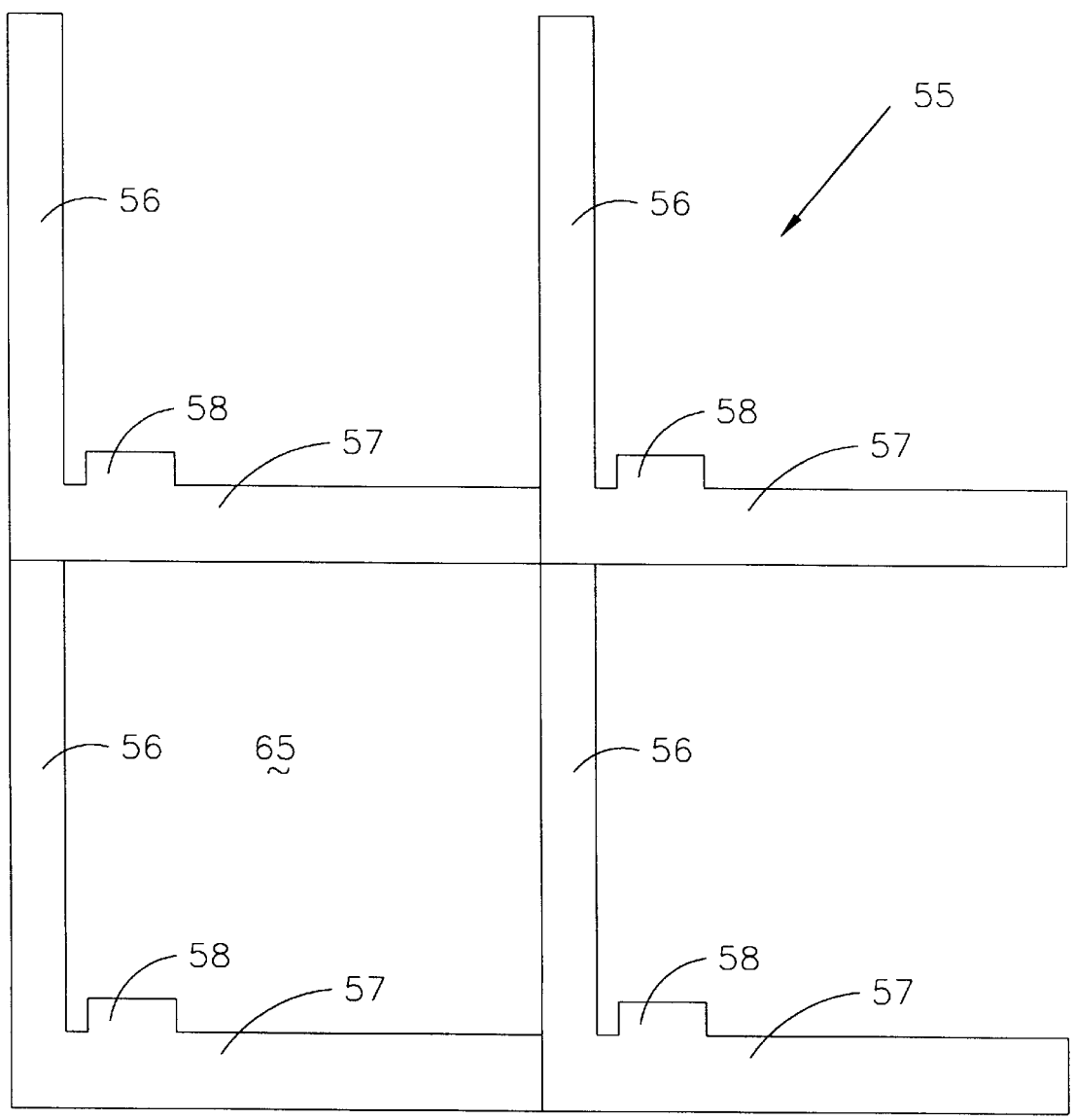
FIG. 8 is a top or bottom view of the optional black matrix to be located on a substrate of the LCD of FIGS. 3–7, the black matrix to be located on the substrate not having the TFT array disposed thereon.

FIG. 8 illustrates an optional black matrix (BM) pattern 55 to be disposed on front substrate 51 for the purpose of overlaying address lines 5 and 7 and TFT channels 27. When the ITO of the pixel electrodes 3 overlaps the address lines, the address lines themselves are effectively the black matrix blocking light in the interpixel areas. However, low reflectance black matrix 55 with a larger than normal opening is still useful on the top (or passive) plate in order to reduce specular reflectance and to prevent ambient light incidence on the TFT channels. Therefore, the pixel aperture ratio of the display can be made larger because the pixel electrode area is larger and the overlap between the pixel electrodes on the active plate and black matrix 55 on the passive plate can be reduced.

Black matrix structure 55 includes vertically extending regions 56 and horizontally extending regions 57. Regions 56 are aligned with drain lines 5 while regions 57 are aligned with gate lines 7 so as to prevent ambient light from penetrating the display. Additionally, black matrix 55 includes channel covering portions 58 which are aligned with TFT channels 27 for the purpose of preventing ambient light from reaching amorphous silicon semiconductor layer 23 through the channels. As commonly known in the art, the pixel openings 65 of the display are substantially defined by black matrix regions 56 and 57.

Figure 9:
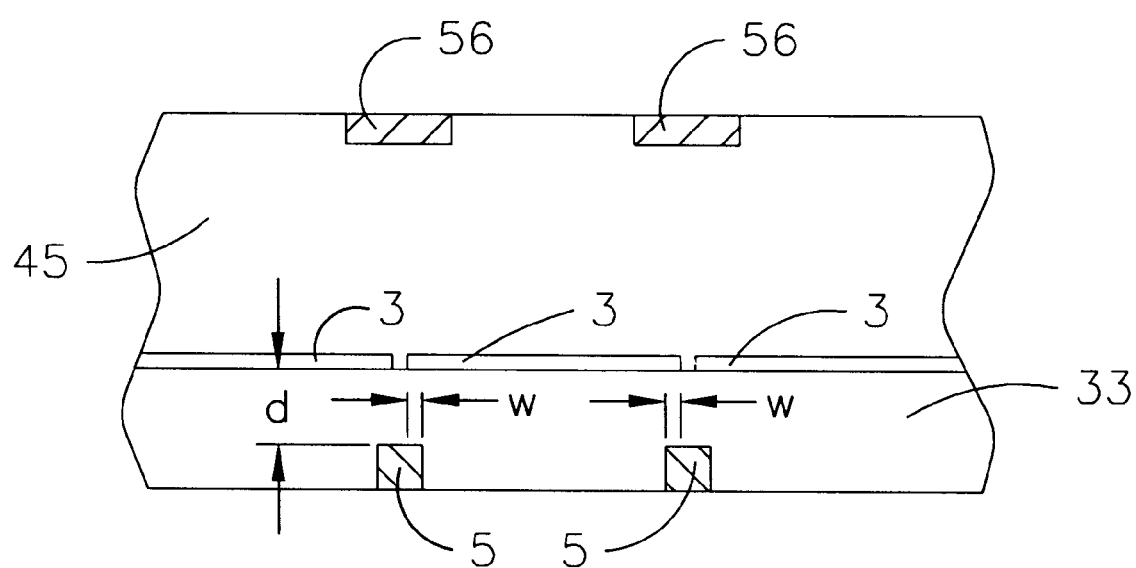
FIG. 9 is a side cross-sectional view of a portion of the LCD of FIGS. 3–8, this figure illustrating the pixel electrodes overlapping the column address lines.

FIG. 9 is a side elevational cross-sectional view of a portion of AMLCD 2. As shown, the central pixel electrode 3 illustrated in FIG. 9 overlaps both column or drain address lines 5 thereby increasing the pixel electrode size relative to that of many prior art displays. Also, black matrix portions 56 line up with address lines 5 so that the pixel aperture or opening for the center electrode 3 is defined by the distance between black matrix members 56. Black matrix portions 56 and address lines 5 are both arranged so that their central axes correspond with the gaps between pixel electrodes 3 according to certain embodiments of this invention. The presence of layer 33 substantially reduces the parasitic capacitance of the capacitor created between pixel electrodes 3 and address lines 5 in the overlap areas 18 as set forth above.

Once given the above disclosure, many other features, modifications, and improvements will become apparent to the skilled artisan. Such other features, modifications, and improvements are, therefore, considered to be a part of this invention, the scope of which is to be determined by the following claims.

We claim:

1. A liquid crystal display with a large pixel aperture ratio comprising:

a liquid crystal layer sandwiched between first and second substrates;

an array of thin film transistors and corresponding pixel electrodes mounted on said first substrate, each of said thin film transistors including a semiconductor layer, a gate electrode connected to a gate address line, a drain electrode connected to a drain address line, and a source electrode in communication with one of said corresponding pixel electrodes, and wherein said pixel electrode connected to said source electrode overlaps said gate and drain address lines along longitudinal edges thereof; and a substantially continuous insulating layer at least about 1.5 µm thick, said insulating layer having a dielectric constant $\epsilon$ no greater than about 3.0 and being disposed between said pixel electrode and said address lines in order to reduce capacitive cross-talk in the display by reducing the pixel electrode-address line parasitic capacitance $C_{PL}$ in the areas of overlap.

2. The liquid crystal display of claim 1, wherein $C_{PL}$ is defined by the equation:

$$C_{PL} = \frac{\epsilon \cdot \epsilon_0 \cdot A}{d}$$

where $\epsilon_0$ is $8.85 \times 10^{-14}$ F/cm, "d" is the insulating layer thickness in the overlap areas, and "A" is the area of the capacitor formed between said pixel electrode and said address lines in the overlap area; and wherein $C_{PL}$ is less than or equal to about 0.01 pF when the pixel pitch of the display is about 150 µm so as to reduce cross-talk in the display.

3. The liquid crystal display of claim 1, wherein "d" is from about 2 to 3 µm in the overlap areas and said insulating layer has a degree of planarization of at least about 90%.

4. The liquid crystal display of claim 1, wherein the display has a pixel aperture ratio of at least about 65%, and a pixel pitch of from about 40 to 500 µm.

5. The liquid crystal display of claim 4, wherein said pixel aperture ratio is at least about 75%.

6. The liquid crystal display of claim 1, wherein said pixel electrode overlaps said gate and drain address lines along substantially their entire lengths so as to increase the pixel aperture ratio of the display.

7. The liquid crystal display of claim 1, wherein at least one via is defined for each pixel in said insulating layer so that said pixel electrode can be electrically connected to said source electrode through said via.

8. The liquid crystal display of claim 7, wherein said insulating layer defines another via for each pixel so that said pixel electrode can also be connected to a storage capacitor electrode through said another via.

9. The liquid crystal display of claim 1, wherein said insulating layer includes Benzocyclobutene (BCB) and has a dielectric constant $\epsilon$ of about 2.7 or less.

10. The liquid crystal display of claim 1, wherein said pixel electrode overlaps said address lines along their lengths by at least about 0.5 µm.

11. The liquid crystal display of claim 1, wherein said semiconductor layer is intrinsic amorphous silicon and is disposed between (i) said gate electrode and (ii) said source and drain electrodes.

12. The liquid crystal display of claim 11, wherein said pixel electrode is indium-tin-oxide and said drain electrode is Mo.

13. A thin film transistor (TFT) structure comprising:
a substantially transparent substrate;
a gate electrode located on said substrate and in communication with a first address line;
a semiconductor layer located on said substrate over said gate electrode;
a drain electrode located on said substrate over said semiconductor layer and in communication with a second address line;
a source electrode located on said substrate over said semiconductor layer and spaced from said drain electrode so as to define a thin film transistor channel, said source electrode electrically in communication with a pixel electrode;
an insulating layer located on said substrate over said first and second address lines and over said source and drain electrodes, said insulating layer being at least about 1.5 µm thick and having a sufficiently low dielectric constant value $\epsilon$ so that where said pixel electrode overlaps one of said first and second address lines, the resulting pixel electrode-address line parasitic capacitance $C_{PL}$ is no greater than about 0.01 pF so as to substantially eliminate cross-talk; and
wherein said insulating layer is located between said pixel electrode and said address lines, and wherein the TFT structure has a pixel aperture ratio of at least about 65%.

14. The TFT structure of claim 13, wherein said insulating layer includes Benzocyclobutene (BCB) and has a dielectric constant $\epsilon$ of less than about 3.0.

15. The TFT structure of claim 13, wherein said insulating layer has a dielectric constant of less than about 3.0.

16. A liquid crystal display having a large pixel aperture ratio comprising:
a liquid crystal layer sandwiched between first and second substrates;
an array of thin film transistors and corresponding pixel electrodes mounted on said first substrate, each of said thin film transistors including a semiconductor layer, a gate electrode in communication with a gate address line, a drain electrode in communication with a drain address line, and a source electrode in communication with a corresponding one of said pixel electrodes, wherein said one pixel electrode overlaps said gate and drain address lines along longitudinal edges thereof; and
a substantially continuous insulating layer at least about 1.5 µm thick disposed between said pixel electrode and said address lines in sufficient thickness so that the pixel electrode-address line capacitance $C_{PL}$ in the areas of overlap is less than about 0.01 pF when the pixel pitch is about 150 µm as a reference pixel pitch.

17. The transistor of claim 13, wherein said insulating layer is at least about 1.5 µm thick in an area of overlap between said first address line and said pixel electrode.

* * * * *